United States Patent [19]

Biltgen et al.

[11] Patent Number: 5,549,764

[45] Date of Patent: Aug. 27, 1996

[54] WEAR RESISTANT COATED STEEL ARTICLE

[75] Inventors: Gary L. Biltgen; Kenneth W. Burris, Both of Peoria; Timothy M. Nenne, Wenona; Phil J. Shankwitz; John B. Walenta, both of Peoria, all of Ill.

[73] Assignee: Caterpillar Inc., Peoria, Ill.

[21] Appl. No.: 426,518

[22] Filed: Apr. 21, 1995

[51] Int. Cl.$^6$ ........................................................ C23C 8/22
[52] U.S. Cl. .......................... 148/222; 148/319; 428/627
[58] Field of Search ............................. 148/222, 319; 428/627

[56] References Cited

U.S. PATENT DOCUMENTS 4,921,025  5/1990  Tipton et al. .............................. 428/627

FOREIGN PATENT DOCUMENTS

| 62188771 | 8/1987 | Japan | 148/222 |
| 1147052 | 6/1989 | Japan | 148/222 |
| 1205064 | 8/1989 | Japan | 148/222 |

Primary Examiner—Deborah Yee
Attorney, Agent, or Firm—Pankaj M. Khosla

[57] ABSTRACT

A coated wear resistant steel article has a basic carburized low silicon steel article of preselected properties including carbides isotropically exposed and having an elevation greater than material adjacent said carbides of said carburized surface and a coating material having a hardness greater than about 1200 Kg/mm covering the material adjacent said carbides of said carburized surface. In another aspect, the coating material is absent and the surface is modified by ion implantation.

14 Claims, 3 Drawing Sheets

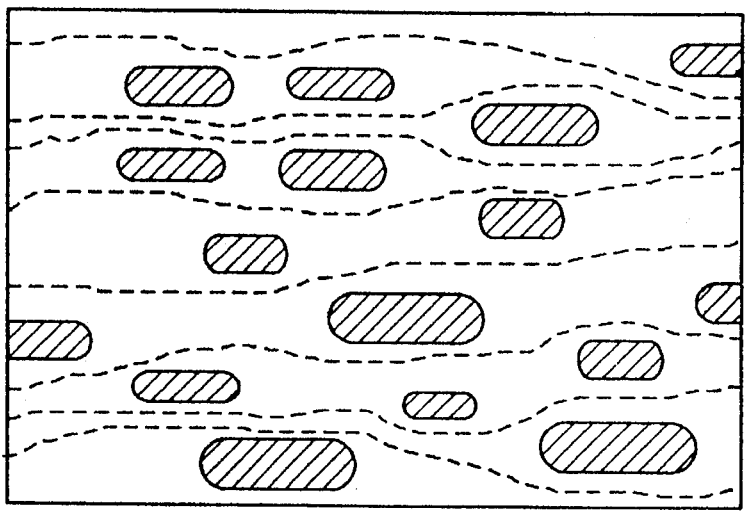
Fig_1A_
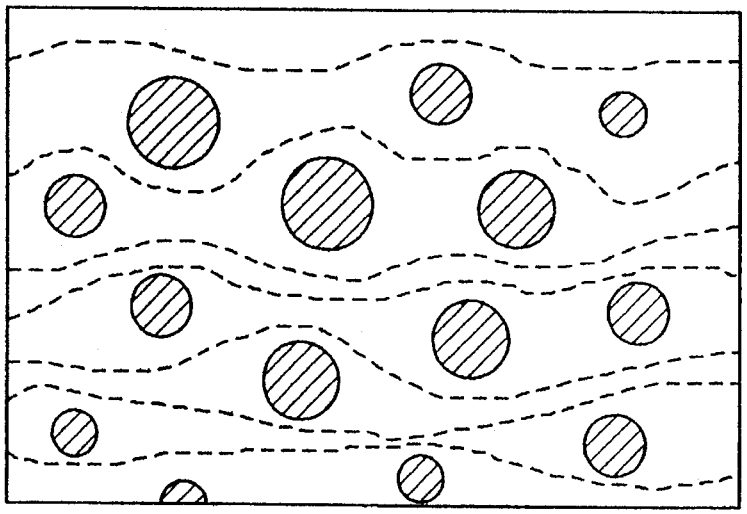
Fig_1B_
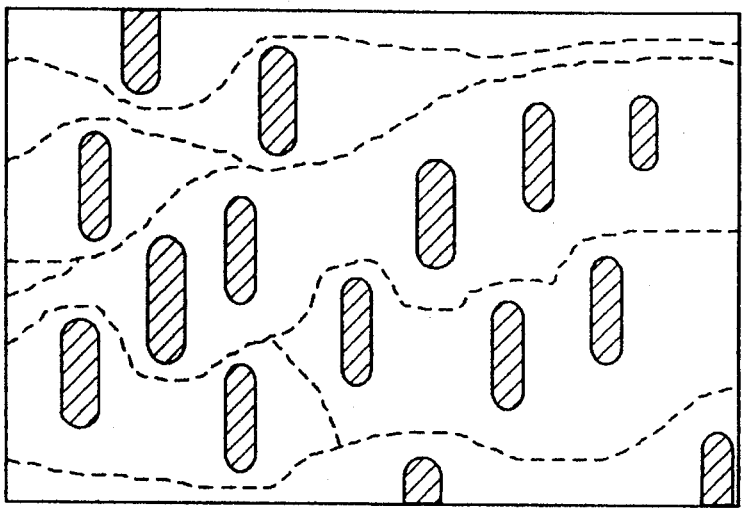
Fig_1C_

Fig-2-
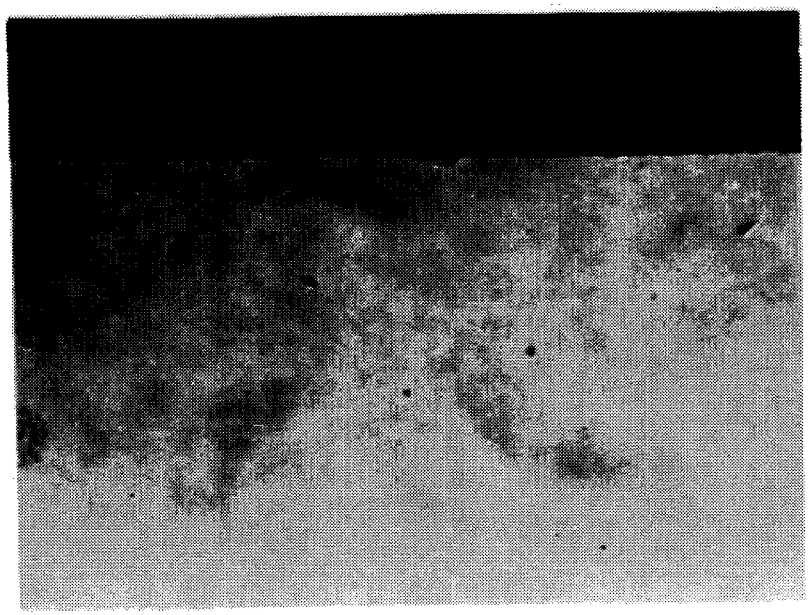
Fig-3-
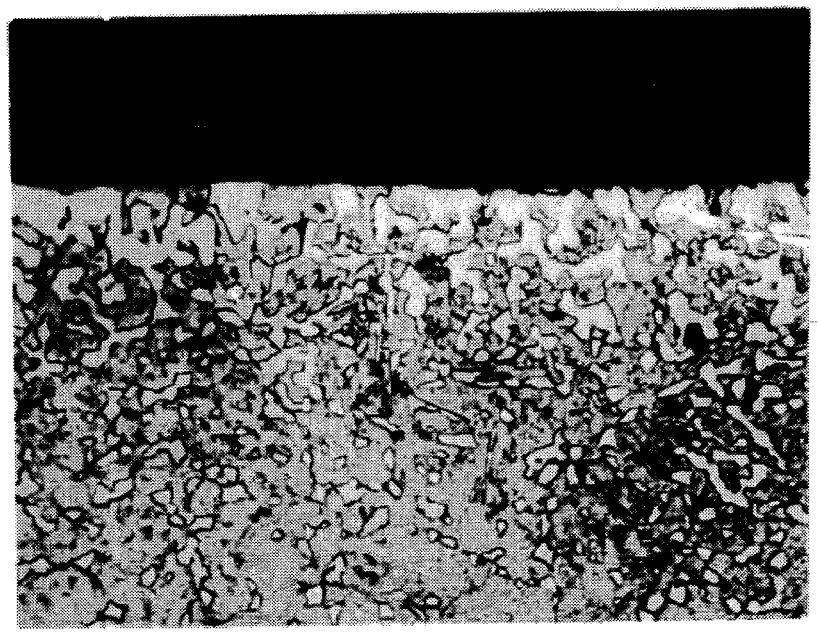

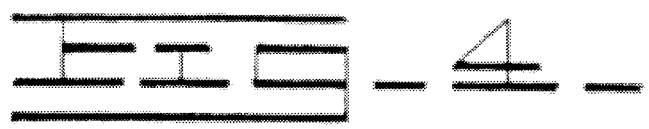
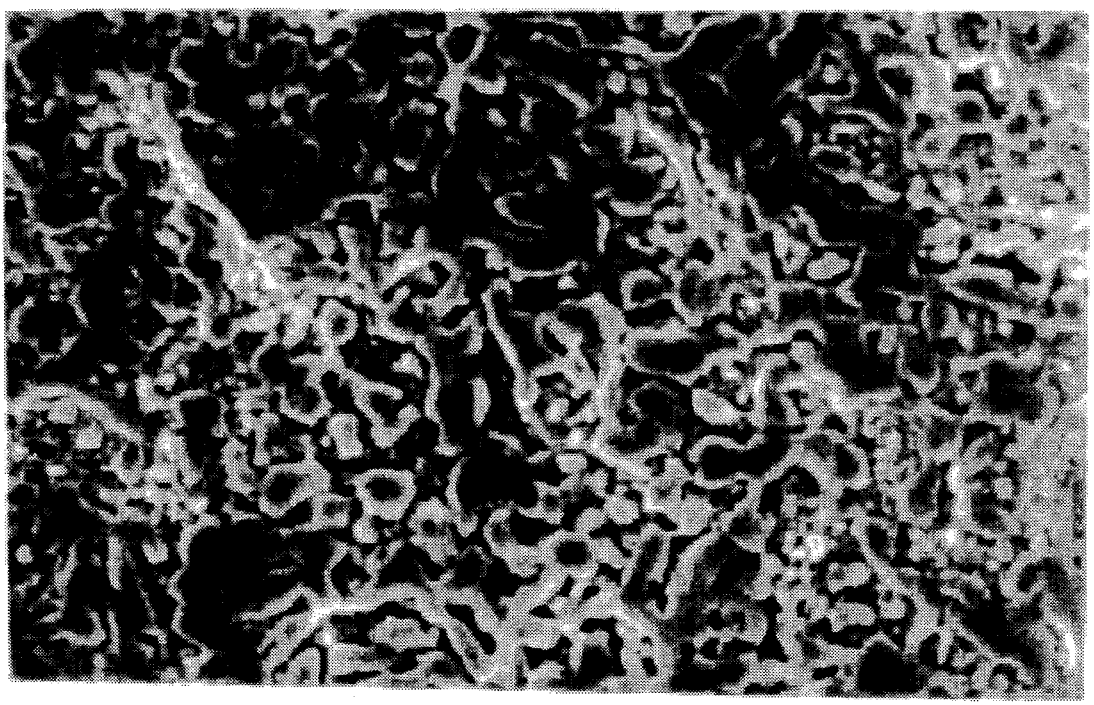

WEAR RESISTANT COATED STEEL ARTICLE

TECHNICAL FIELD

This invention relates generally to metal heat treatment and more particularly to case hardening with a gas containing carbon, etching the material and coating the etched material to provide a coated wear resistant steel article.

BACKGROUND ART

Carburizing is an effective method of increasing the surface hardness of low carbon, unalloyed, or low carbon, low alloy steels. Typically, steel articles are placed in an atmosphere containing carbon in an amount greater than the base carbon content of the steel and heated to a temperature above the austenite transformation temperature of the steel. After the desired amount of carbon has been diffused into the article, hardness is induced by quenching.

Gas carburizing is efficient, controllable, and one of the most widely used methods of supplying the carbon to the surface of the steel.

Conventional carburizing and hardening processes typically try to avoid the formation of case carbides. The general aim is to produce an essentially carbide free martensitic structure in the carburized and hardened case. Silicon effects surface carbide formation and, by limiting the amount of silicon in a carburizing steel, as taught in the present invention and as set forth in U.S. Pat. No. 4,921,025 "Carburized Low Silicon Steel Article and Process" which issued May 1, 1990 to Sheryl A. Tipton et al. and is assigned to Caterpillar Inc.,surface carbides may be easily formed.

Conventional gas carburizing processes, as discussed above, generally attempt to prevent the formation of case carbides by maintaining carbon potential at or slightly above eutectoid carbon content. A nonconventional carburizing process for intentionally forming carbides in the case is described in Canadian Pat. 610,554, "Carburization of Ferrous Alloys", issued Dec. 13, 1960 to Orville E. Cullen. Cullen teaches a method for carburizing low alloy steel by repeatedly carburizing and rapidly cooling the steel article.

More recently, a two stage carburizing process was described in U.S. Pat. No. 4,202,710, issued May 13, 1980, to Takeshi Naito, et al. That process forms spheroidal carbides within a region between 0.1 mm and 0.4 mm below the case surface, but fails to provide a high density of carbides on the outer surface of the carburized case. As a result, articles formed by this teaching must initially wear, or be machined down to the carbide rich zone beginning 0.1 mm below the surface before the enhanced wear and contact fatigue properties of the carbide microstructure, such as pitting and spalling resistance, can be advantageously utilized.

It is well known that lubricated concentrated rolling contacts can fail from surface or subsurface initiated pitting. Sliding contacts can fail from excessive wear, scuffing or seizure. These failure mechanisms are controlled globally by oil film thickness, hertzian contact stresses, and lubrication at asperity contacts. These factors, in conjunction with other factors, determine the distribution of contact stresses near asperities, friction coefficient, and contact flash temperature. All of these factors will influence pitting and scuffing failures.

Contacts in gears usually operate in the region of mixed-film lubrication where the film thickness to roughness ratio, lambda, is less than three. This results in the load being shared between the fluid and the asperity contact. The lubrication behavior in this region is influenced by the overall distributions of lubricant film thickness, pressure, shear stress and flash temperatures within the hertzian contact and the local variation of these quantities around the asperity contacts.

Micro-EHL theory developed by H. S. Cheng and Nadir Patir, "An Average Flow Model for Determining Effects of Three-Dimensional Roughness on Partial Hydrodynamic Lubrication", ASME Vol 100, January 1978, proposes that the ratio of metallic asperity contact to total area depends on the directionality of the surface roughness, or lay of machine grooves. The model is demonstrated and the flow resistance of the lubricant is greater in FIG. 1-B and FIG. 1-C than in FIG. 1-A of Prior Art FIG. 1. The volume of the retained lubricant is increased and therefore the thickness of the oil film is also increased.

Akamatsu et al, "Improvement of Roller Bearing Fatigue Life by Surface Roughness Modification", SAE paper No. 910958, 42nd Earthmoving Industry Conference, Peoria, Ill. April 1991, taught how to expand on Cheng's theory and produce rolling element bearings with a superfinished surface exhibiting small (10 micron) random pits. The depth of the pits are about (1 micron). The resultant surface possesses no directional characteristics (isotropy). The isotropic texture resulted in 2.0 to 13 times longer life than normal bearings.

Sliding, inherent in gear contacts, shifts the peak value of the hertzian shear stress to the surface. This combination of rolling and sliding can initiate fatigue cracks at the surface that will result in pit formation.

A high percentage of carbides produced at the surface of a component result in greater high temperature strength, resistance to wear, and increased pitting life.

In addition to the differences of the above cited references and the instant invention, none of the references teach or suggest isotropically exposed carbides on the surface which have an elevation greater than material adjacent the carbides of the carburized surface or coating said surface with a coating material having a hardness greater than about 1200 Kg/mm for the purpose of enhancing oil film thickness, friction coefficient, contact stresses and contact temperatures which influence pitting and scuffing performance.

DISCLOSURE OF THE INVENTION

In one aspect of the invention, a coated wear resistant steel article of this invention comprises a basic article and a coating material. The basic article is a carburized steel characterized by having not more than 0.1% silicon and less than 1.1% chromium, by having a carburized surface that is substantially free of detrimental intergranular oxides, and having carbides on said carburized surface with said carbides comprising at least 20% of the area of the carburized surface,and said carbides being isotropically exposed and having an elevation greater than material adjacent said carbides of said carburized surface. The coating material has a hardness greater than about 1200 Kg/mm and covers the carbides and material adjacent said carbides of said carburized surface. Said coating is one of boron carbide, chromium nitride, titanium carbide, titanium aluminum nitride, and titanium boride.

BRIEF DESCRIPTION OF THE DRAWINGS

FIGS. 1(A), 1(B) and 1(C) are Prior Art of the Patir/Cheng paper showing a representation of typical contact areas for longitudinally oriented, isotropic and transversely oriented surfaces;

FIG. 2 is Prior Art of U.S. Pat. No. 4,921,025 showing a crossection of low silicon steel with no intergranular oxidation;

FIG. 3 is Prior Art of U.S. Pat. No. 4,921,025 showing a crossection of low silicon steel having carbides at the surface; and FIG. 4 is a scanning electron microscope image of the low silicon steel having carbides of the surface which has been etched to form the basic article of the subject invention also showing the microscopic isotropy of the surface.

BEST MODE FOR CARRYING OUT THE INVENTION

A basic article of the invention, for example a gear, is formed, the surface of the article is chemically etched and a coating material covers the carbides and material adjacent isotropically exposed carbides of the etched surface.

A low silicon steel is selected, carburized, controllably cooled to the hardening temperature and quenched. As used herein the term "low silicon steel" means a steel material containing from about 0% silicon to no more than about 0.10% silicon, and whose composition in all other respects is recognized as generally suitable for carburizing. Restricting, or eliminating the amount of silicon in the steel not only represses the formation of silicon oxides but also inhibits the oxidation of chromium and manganese on the surface of the carburized article. Furthermore, when low silicon steel articles are processed in accordance with the present invention, the formation of a high ratio of carbides on the surface is assured. Accordingly, selection of an appropriate steel composition is an important step.

Commercially produced low alloy carburizing grade steels typically have a composition, by weight, within the following ranges:

| | |
|---|---|
| Carbon | 0.08%–0.35% |
| Manganese | 0.3%–1.7% |
| Carbide forming elements such as Chromium, Molybdenum or Vanadium (total) | 0.2%–2.5% |
| Additional Hardenability agents | 0.0%–6.0% |
| Silicon | 0.15%–0.35% |
| Grain refining elements | 0.0%–1.0% |
| Iron and residual elements | Balance. |

The above steel compositions, if silicon is deleted or restricted to 0.10% or less, is suitable for the formation of carburized base articles of the present invention.

The accepted steel industry standard allowable residual amount of copper in steel compositions is 0.35%. It has been found that low silicon steels having copper toward the upper limit of such amount are sometimes inconsistent in the formation of carbides on the carburized surface. It is theorized that copper may inhibit the formation of surface carbides. Accordingly it is desirable, though apparently not essential in all cases, to limit the amount of copper in the composition to not more than 0.15%.

More specifically, a low alloy carburizing grade steel, such as one of the SAE 4110 to 4130 series, all modified particularly to limit silicon to no more than 0.10%, are particularly suited for the formation of carburized articles such as gears, bearings and shafts. Therefore, commercial low alloy carburizing grade steels containing relatively small but essential amounts of carbide forming elements such as chromium, molybdenum or vanadium, may be modified to be a low silicon steel composition. Additional hardenability agents may be included but should be limited to amounts less than about 6%. Grain refining elements in amounts less than 1% are often added to promote fine grain size. As noted above, it is also desirable to limit residual or trace amounts of copper to no more than 0.15% to further enhance surface carbide formation. Deleterious elements such as phosphorus and sulfur, often present in trace amounts, are preferably limited to no more than about 0.05% and about 0.08% respectively.

The basic articles of the above described compositions are shaped to a predetermined form by machining from rolled steel, by casting or forging, by consolidating steel powder, or by a combination of forming operations.

After shaping the basic article, it is placed into a carburizing furnace and heated to a temperature sufficient to diffuse carbon from the furnace atmosphere into the basic article and form a high density of carbides on the surface of the basic article. Preferably, the carburizing operation is carried out in two stages. In the first carburizing stage, the carbon potential of the gas atmosphere in the furnace is maintained at a level of about equal to the saturation limit of carbon in austenire. The saturation level of carbon in austenire, generally designated as "$A_{cm}$", is temperature dependent. The shaped article is preferably placed directly into a continuous type furnace having a temperature within the carburizing chamber of from about 1550 degrees F. to about 1850 degrees F. and an atmosphere about equal to the $A_{cm}$ corresponding the specific steel composition of the article.

The first stage of the carburizing process includes holding the article in the carburizing chamber for a period of time sufficient to develop about 75% to about 95% of the desired final case depth. As used herein, "case depth" is the distance below the surface where the carbon content is at 0.40%. The time required to achieve the desired case depth of the article is dependent on a number of parameters, such as the chemical composition of the article, and composition and temperature of the gas atmosphere. Hence, the length of time that the article is held in the carburizing chamber in this first stage may vary from about 2 to about 25 hours. When the article has the low silicon composition described above, the carbon potential of furnace atmosphere is maintained as close as possible to the $A_{cm}$ of the particular steel, and the carburizing temperature is maintained at about 1700 degrees F., an initial case depth of about 1.0 mm can be achieved by holding the article in the furnace for about 4 to 5 hours. After completion of the second stage carburizing operation, described below, the final case depth is about 1.1 mm.

After the first stage carburizing operation, the article is cooled, preferably by gas quenching, to a temperature below that at which bainite and pearlite begin to form. It is desirable to cool the surface of the article rapidly in this operation to suppress network carbide formation. This results in the formation of a supersaturated, metastable, solid solution of iron, carbon, and alloying elements. If excessively slow cooling rates are used, carbides will form at grain boundaries, and not provide effective intergranular nuclei for the formation of carbides.

After cooling the article to a temperature sufficiently low to assure the substantially complete transformation to bainite or pearlite, the article is quickly reheated by placing it into a preheated carburizing furnace. This causes a homogenous carbide precipitation from the metastable solid solution and results in a dispersion of carbides in the case microstructure.

During the second stage carburizing operation, the carbon potential of the furnace atmosphere is above the saturation limit of carbon in austenite of the basic article. For example, an atmosphere having a carbon potential of about 1.5% to about 2% can be provided by a gas having a composition of 0.055% CO, 1% CH, 20% CO, 40% H and the balance N. Typically, the temperature of the second stage carburizing chamber is maintained between about 1550 degrees F. and 1850 degrees F., and preferably at about 1700 degrees F. In the second stage it is only necessary to reaustenitize the case of the basic article in a superaturated gas environment and thereby increase the surface carbon to a level above 1.5%. The article need be held for only about 15 to 60 minutes at 1700 degrees F. to achieve the desired case carbon content. Although lower temperatures may be used, it will require holding the article in the furnace for a corresponding longer time. Also, it has been found that the size and volume fraction of the surface carbides present in the carburized article can be controlled by selection of the second stage carburizing temperature and the rate of cooling in the subsequent cooling step described below. For example, higher second stage carburizing temperatures tend to produce more carbides, i.e., a higher volume fraction of larger carbides, on the surface of the article.

Upon completion of the second stage carburizing operation an austenitic microstructure having high density of well dispersed surface carbides has been formed. The basic article, preferably while still in the furnace, is then controllably cooled to the hardening temperature of the steel core. By way of example, the hardening temperature of SAE 4118 steel having a low silicon composition, is about 1540 degrees F. During the cooling operation, the previously formed carbides increase in size and volume fraction. To achieve this, the cooling rate of the article from the carburizing to hardening temperature is carefully controlled. Advantageously, the cooling rate is about 1 degree F. to about 20 degrees F. per minute.

After cooling the surface of the basic article to the hardening temperature, it is desirable to maintain the basic article at the hardening temperature for a length of time sufficient to permit the temperature in the core of the basic article to cool to the hardening temperature. This process is known as equalizing. Although desirable to minimize distortion, equalizing is not essential to obtain the desired surface microstructure. Depending on the basic article's mass and geometry, equalizing typically takes about 5 to 60 minutes to complete.

A carbonaceous gas atmosphere is advantageously maintained about the article during the preceding cooling and equalizing operations to prevent carbon depletion at the surface of the basic article. Both cooling and equalizing may be carried out in the second stage carburizing furnace, or in an interconnecting chamber, so that the same gas atmosphere used in carburizing may be simply cooled and circulated about the article.

After equalizing, the basic article is preferably directly quenched from the hardening temperature at a rate sufficiently rapid to transform the surface microstructure to martensite, retained austenire and carbides. For this, an oil medium is used with a quench rate high enough to assure the desired surface transformation.

Shafts and gears are exemplary of basic articles subjected to high bending loads, surface wear, and contact fatigue. Such basic articles have been successfully formed in accordance with the above described process.

Testing has shown that the steel material from which a basic article is formed must contain no more than about 0.10% silicon. Limiting the silicon content to this amount not only inhibits the formation of intergranular oxides, but also promotes and enhances the formation of desirable carbide structures on the surface. Secondly, a high ratio of carbides are formed on the outer surface of the article, (i.e., the as-carburized surface without any material removal therefrom), and not at some finite depth, e.g. 0.1 mm or more, below the surface. Example tests and properties can of the basic article of this invention can be found in U.S. Pat. No. 4,921,025, as further identified above.

After so forming the basic article, as is preferably set forth above, the surface of the basic article is chemically etched to isotropically expose the carbides and develop a surface wherein the elevation of the exposed carbides is greater than the material adjacent said carbides on said carburized surface. It should be understood however, that the basic article can be formed by other processes, for example forming carbides subsurface and thereafter shaving off the top layer prior to etching. In the preferred embodiment of this invention, the elevation of said carbides is at least 1 micron greater than material of said carburized surface adjacent said carbides. This dimension "X" can however be in the range of about 0.1 to about 10 microns.

The chemical etching of the basic article is preferably by an electro-polishing process using a 60/40 mixture of sulfuric and phosphoric acid in a dip with voltage of about 30 amps. for about 80 seconds. Other acids and acid mixtures and other voltage and times can be used in the process and achieve the desired results.

The etched basic article is thereafter heated in an oven to a temperature and for a time sufficient to prevent hydrogen embrittlement. Preferably, the basic article is heated to about 200 degrees F. for about two hours. However with varying sizes of the article, the heating time can vary to some degree.

After the basic article is so treated, the surface of the article is coated by physical vapor deposition with a hard coating preferably selected from one of the carbides, nitrides, borides and carbonitrides of chromium, titanium, aluminum and boron, preferably boron carbide.

This coating process is carried out until the coating covers the entire surface with a conformal layer not greater than about 3 microns in thickness.

The coating material selected should have a hardness greater than about 1200 Kg/mm. Preferably, the coating material hardness will be greater than the hardness of the carbides of the basic article so that hardness and temperature resistance is improved.

Referring to Prior Art FIGS. 1–3 and FIG. 4, one can see the progression of the prior art of the basic article (FIGS. 1–3). In FIG. 4, the basic article of U.S. Pat. No. 4,921,025 has been etched and is isotropic with carbides on the tops of the elevated projections.

In the subject invention, the acid etch relieves the surface adjacent the carbides. Exposed carbides are about 1 micron above the adjacent surface and the resulting surface displays a microscopic isotropic roughness. When two surfaces are under relative motion, this roughness provides a force on the lubricating oil to draw it into the hertzian contact region and thus increase oil film thickness.

The unique isotropic hard carbide surface is then coated with a thin (2um) species with higher hardness than the carbides of the basic article. The coating is sufficiently thin to effectively conform to the isotropic surface produced by the etching. The resulting novel surface is an engineered surface of thin hard coating, hard carbide, hard coating in the valleys, and a microscopic isotropic finish.

A typical process for producing a gear is to hob and shave. The machining grooves resulting from the shaving operation have a diagonal lay running from root to tip across the gear tooth flank. The geared roller test machine (GRTM) developed by Caterpillar Inc. uses circumferentially ground load and test rollers. This test produces combined rolling and sliding hertzian contacts which effectively simulate and can be correlated with shaved gear teeth.

GRTM tests were conducted at a range of contact stress and lambda. The results of that testing showed that the un-etched basic article have about a 2× higher 50% failure rate life. However, at lower failure percentages (less than 10%) the basic article is comparable to carburized and harden.

The contact fatigue life of the isotropic/coated basic article has a greatly improved Weibull slope, which results in a 2.5× improvement in pitting fatigue life at 2% failure rate. It was further discovered that as lambda increases, there is less asperity contact, the improvement over the baseline material is even greater (5×) than that at the severe asperity contact at low lambda. It is theorized that, at higher lambda values, the micro-isotropic surface roughness increases oil film thickness over the predicted values and reduces the amount of asperity contact, thus providing an increase in longevity.

In another aspect of the invention, ion implantation surface modification incorporates an element into the surface of an article. The article is placed into a chamber with a gas containing the desired element to be implanted into the surface. The gas is ionized and the article is given an electrical charge of the opposite sign as the gaseous ions. High voltages accelerate the desired ions to be implanted at the surface of the article with the end result being modification of near surface chemistry, coefficient of friction, wear resistance, surface hardness, crystal structure, corrosion resistance, etc. The depth of the implanted species can be modified through control of accelerating voltage, and substrate temperature. Ion implantation produces no dimensional or visual change in the article in producing its improved performance.

Industrial Applicability

Articles formed according to the above are particularly useful as gears, couplings, shafts, bearings, and similar articles subjected to a combinations of high bending loads, surface wear and contact fatigue. Further, by so providing the unique coating of this invention, the resultant article yields improved service life and provides for higher power densities.

We claim:

1. A coated wear resistant steel article, comprising:

a basic article being of carburized steel, said article having a carburized surface, and having carbides on said carburized surface with said carbides comprising at least 20% of the area of said carburized surface, said carbides being isotropically exposed and having an elevation greater than material adjacent said carbides of said carburized surface; and a coating material having a hardness greater than about 1200 Kg/mm covering said carburized surface with a conformal layer not greater than 3 microns in thickness, said coating material being one of boron carbide, chromium nitride, titanium carbide, titanium aluminum nitride, and titanium boride.

2. An article, as set forth in claim 1, wherein said elevation of said carbide is at least "X" micron greater than material of said carburized surface adjacent said carbides.

3. An article, as set forth in claim 1, wherein said elevation difference "X" is at least 0.1 micron.

4. An article, as set forth in claim 1, wherein said coating covers substantially all of said carburized surface.

5. An article, as set forth in claim 1, wherein said carburized surface is a chemically etched surface.

6. An article, as set forth in claim 1, wherein the article is substantially free of hydrogen embrittlement.

7. An article, as set forth in claim 1, wherein the coated article is substantially the same dimensions as the basic article.

8. An article, as set forth in claim 1, wherein the hardness of the coating material is greater than the hardness of the carbides of the basic article.

9. An article, as set forth in claim 1, wherein the basic article is virtually free of any intergranular oxides at the entire carburized surface.

10. An article, as set forth in claim 1, wherein the total length of the intergranular oxides in a representative cross-section of the basic article is not more than about 15% of the length of the carburized surface of the basic article in said crossection.

11. An article, as set forth in claim 1, wherein the composition, by weight, of the basic article includes about 0.08% to about 0.35% carbon and about 0.2% to about 2.5% carbide forming elements including said chromium.

12. An article, as set forth in claim 1, wherein said basic article has a composition consisting essentially of, by weight, about 0.08% to about 0.35% carbon, about 0.3% to about 1.7% manganese, not more than about 0.10% silicon, less than about 1.1% chromium, about 0.2% to about 2.5% carbide forming elements including said chromium, less than about 6% additional hardenability agents, less than 1% grain refining elements, not more than about 0.15% copper, and the balance iron and trace impurities.

13. An article, as set forth in claim 12, wherein carbon is present in an about from 0.18% to about 0.24%, manganese is present in an amount from about 0.8% to about 1.1%, chromium is present in an amount from about 0.4% to about 1.1%, molybdenum is present in an amount from about 0.1% to about 0.5%, silicon in an amount of not more than about 0.05%, not more than about 0.15% copper, and the trace impurities include no more than about 0.05% phosphorus and nor more than about 0.08% sulfur.

14. A wear resistant steel article, comprising:

said article being of carburized steel, said article having a carburized surface, and having carbides on said carburized surface with said carbides comprising at least 20% of the area of said carburized surface, said carbides being isotropically exposed and having an elevation greater than material adjacent said carbides of said carburized surface and said carburized surface being ion implantation modified.

* * * * *